United States Patent
Murayama (10) Patent No.: US 8,495,409 B2
(45) Date of Patent: Jul. 23, 2013

(54) HOST CONTROLLER, SEMICONDUCTOR DEVICE AND METHOD FOR SETTING SAMPLING PHASE

(75) Inventor: Masayoshi Murayama, Hanno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 13/075,309

(22) Filed: Mar. 30, 2011

(65) Prior Publication Data

US 2012/0054531 A1  Mar. 1, 2012

(30) Foreign Application Priority Data

Aug. 31, 2010  (JP) ................ 2010-194681

(51) Int. Cl.
*G06F 1/04* (2006.01)
(52) U.S. Cl.
USPC ............................ 713/401; 713/400; 713/503
(58) Field of Classification Search
None
See application file for complete search history.

(56) References Cited

U.S. PATENT DOCUMENTS

| | | | | |
|---|---|---|---|---|
| 8,286,024 | B2 * | 10/2012 | Fujimoto | 713/503 |
| 2007/0217559 | A1 * | 9/2007 | Stott et al. | 375/355 |
| 2010/0118627 | A1 * | 5/2010 | Best | 365/193 |

FOREIGN PATENT DOCUMENTS

| | | |
|---|---|---|
| JP | 10-028117 | 1/1998 |
| JP | 2007-034540 | 2/2007 |
| JP | 2008-090556 | 4/2008 |
| JP | 2009-284176 | 12/2009 |

OTHER PUBLICATIONS

Japanese Office Action for Japanese Application No. 2010-194681 mailed on Nov. 27, 2012.

* cited by examiner

*Primary Examiner* — Dennis M Butler
(74) *Attorney, Agent, or Firm* — Turocy & Watson, LLP (57) ABSTRACT

According to one embodiment, there is provided a host controller, which samples reception data in a VDS mode and an FDS mode, includes a VDS phase register which holds a phase shift amount in the VDS mode, an FDS phase register which holds a phase shift amount in the FDS mode, a mode setting unit configured to indicate in which of the VDS mode and the FDS mode data is sampled, a sampling position setting unit which selects the phase shift amount set in one of the VDS and the FDS phase register in accordance with a setting value of the mode setting unit, and provides the selected phase shift amount as a sampling position, and a clock phase shift unit which shifts a phase of an input clock signal in accordance with the shift amount, and provides the shifted input clock signal as a sampling clock.

13 Claims, 6 Drawing Sheets

HOST CONTROLLER, SEMICONDUCTOR DEVICE AND METHOD FOR SETTING SAMPLING PHASE

CROSS-REFERENCE TO RELATED APPLICATIONS

This application is based upon and claims the benefit of priority from Japanese Patent Application No. 2010-194681, filed Aug. 31, 2010; the entire contents of which are incorporated herein by reference.

FIELD

Embodiments described herein relate generally to a host controller, a semiconductor device and a method which executes data input/output processing for memory device.

BACKGROUND

SD cards as compact, portable nonvolatile memories, which are used in digital cameras, portable devices such as mobile phones, PCs, and household electrical appliances such as televisions, have prevailed.

An SD card operates based on clock signals received from a host controller, which samples data received from the SD card using clocks transmitted to the SD card. The received data at that time is delayed depending on the wiring length from a host controller LSI to the SD card and a response speed of the SD card. When operation clocks of the SD card exceed several tens of megahertz, this delay often becomes greater than or equal to half an operation clock period. Therefore, the host controller cannot use the transmitted clocks intact upon sampling the received data.

In case of an fixed data sampling (FDS) SD card for which a delay amount in the SD card is specified by specifications, a transmission clock frequency is generally several tens of megahertz, and data reception clocks use signals which are obtained by delaying transmission clocks using a delay line on a board. That is, transmission clock signals, which are transmitted and delayed via the delay line that extends from the host controller and returns to it via the vicinity of a card slot on the board, are used as reception clocks. This method has an advantage that a delay caused by an I/O buffer in the host controller LSI and an actual wiring line on the board need not be taken into consideration.

However, since the aforementioned conventional method requires transmission clock pins arranged on the host controller LSI, it results in an increase in the number of pins and that of power consumption caused by currents flowing through the delay line.

In order to sample received data without using any delay line, sampling clocks have to be generated by giving an appropriate delay to transmission clocks inside the host controller. This delay value has to be decided in consideration of a delay of an I/O buffer included in the host controller, that of a wiring line, and manufacturing variations. Therefore, in this case, it is difficult to decide the delay value. Since this delay is set inside the host controller, when a delay amount changes because of, for example, a change in ambient temperature, the delay amount cannot be changed.

DETAILED DESCRIPTION

In general, according to one embodiment, there is provided a host controller, which samples reception data, comprising: a variable data sampling (VDS) phase register configured to hold a phase shift amount in the VDS mode; a fixed data sampling (FDS) phase register configured to hold a phase shift amount in the FDS mode; a mode setting unit configured to indicate in which of the VDS mode and the FDS mode, data is sampled; a sampling position setting unit configured to select the phase shift amount set in one of the VDS phase register and the FDS phase register in accordance with a setting value of the mode setting unit, and to provide the selected phase shift amount as a sampling position; and a clock phase shift unit configured to shift a phase of an input clock signal in accordance with the shift amount provided from the sampling position setting unit, and to provide the shifted input clock signal as a sampling clock.

Recently, an SD card, which has an operation frequency as high as 200 MHz or more, has been developed. In such SD card, data sampling is generally made in a variable data sampling (VDS) mode. In the VDS mode, when a delay amount changes because of, for example, a change in ambient temperature, a data sampling timing is changed according to the change in delay amount.

In the VDS mode, a signal delay amount is detected, and is supplied as a phase shift amount to a delay locked loop (DLL). Data is sampled using signals obtained by delaying transmission clocks based on the phase shift amount supplied to the DLL.

According to an embodiment, when a host computer compatible with the VDS mode uses an SD card in an FDS mode, data is sampled based on transmission clocks which are delayed using a VDS mode DLL.

In general, precision is higher with decreasing delay amount of the DLL. In order to precisely implement a larger delay amount, an expensive DLL has to be used. Therefore, since a delay amount of the VDS mode DLL is set to be a minimum required value, a maximum delay amount of the VDS mode DLL is normally smaller than a delay amount of the FDS mode SD card. Therefore, the VDS mode DLL cannot be directly used for the FDS mode SD card.

An embodiment will be described hereinafter with reference to the drawings.

Figure 1:
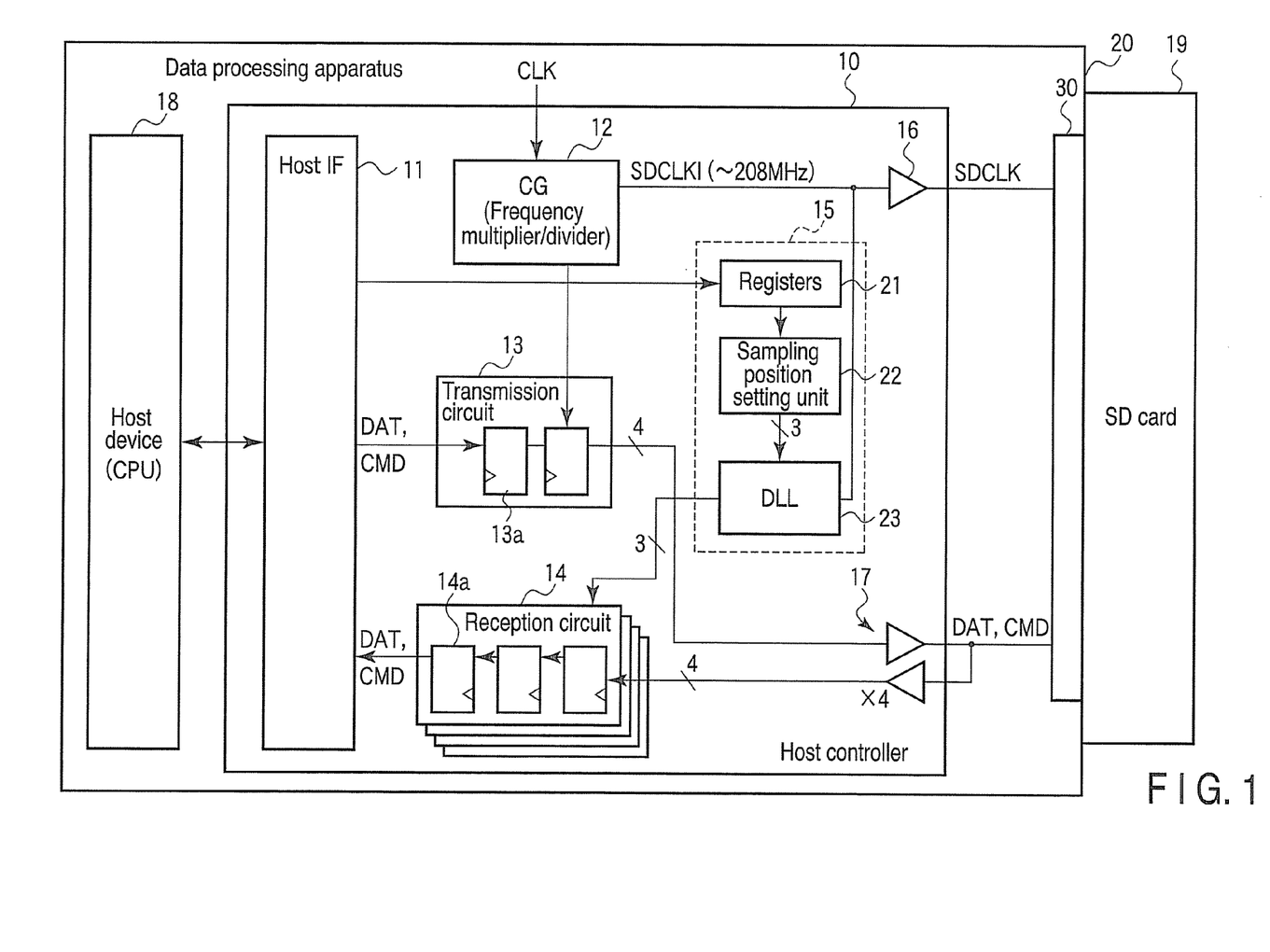
FIG. 1 is a block diagram showing the overall arrangement of a host controller to which the first embodiment is applied.

FIG. 1 is a block diagram showing the principal part arrangement of a data processing system to which the first embodiment is applied.

FIG. 1 includes a data processing apparatus 20 and SD card 22. The data processing apparatus 20 includes a host device 21 and host controller 10. The data processing apparatus 20 is, for example, an electronic apparatus such as a digital camera or PC. The data processing apparatus 20 and SD card 22 are connected via an SD card slot 30.

The host controller 10 is configured as, for example, an LSI, and controls data transfer between the host device (for example, a CPU) 18 and the SD card 22. The host controller 10 is directly connected to the SD card via the SD card slot 30. The host controller 10 is also called an SD host controller since it serves as a host-side device which controls the SD card 22.

The host controller 10 includes a host interface 11, frequency multiplier/divider 12, transmission circuit 13, reception circuit 14, sampling signal generator 15, amplifier 16, and input/output gate 17.

The frequency multiplier/divider 12 generates, for example, a clock signal SDCLKI by frequency-multiplying or frequency-dividing a clock CLK generated at a frequency set by the host device, and provides it to respective units as an operation clock. Also, the frequency multiplier/divider 12 provides a signal SDCLK to the SD card via the amplifier 16. The sampling signal generator 15 gives an appropriate delay to the signal SDCLKI, thus providing FDS and VDS sampling clocks used to sample a reception signal.

The host interface 11 controls exchanges of signals such as data DAT and commands CMD according to the specification of the SD card. The transmission circuit 13 outputs signals of transmission data DAT and transmission commands CMD input from the host interface 11 via a multi-bit line while synchronizing the signals using flip-flops (F/Fs) 13a. The reception circuit 14 outputs signals of reception data DAT and reception commands CMD input from the SD card via a multi-bit line while synchronizing the signals using an F/Fs 14a. The input/output gate 17 controls a transmission route of the signals of the data DAT and commands CMD.

Figure 2:
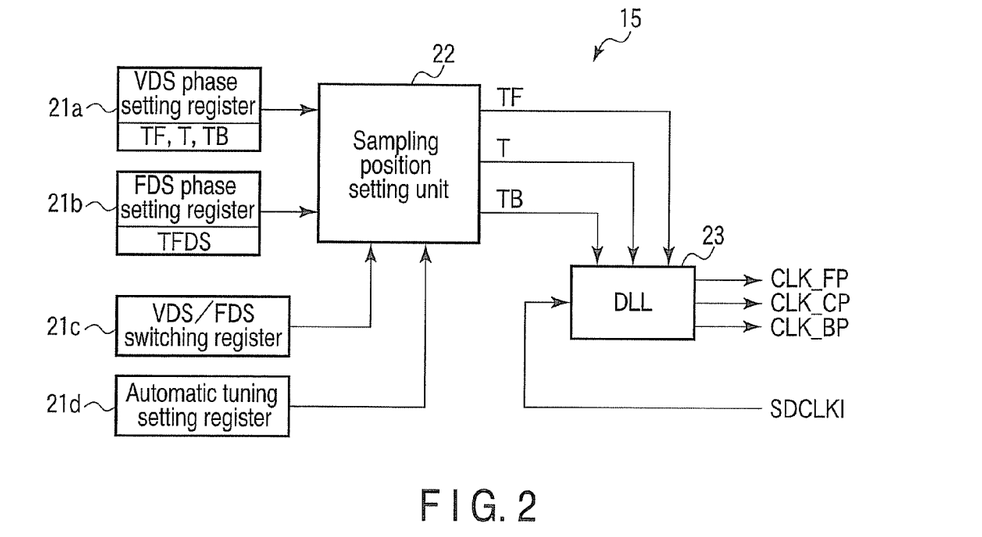
FIG. 2 is a block diagram showing the detailed arrangement around a sampling position setting unit 22 and DLL 23.

FIG. 2 is a block diagram showing the arrangement of the sampling signal generator 15. The sampling signal generator 15 includes various registers 21a to 21d, a sampling position setting unit 22, and clock phase shift unit (referred to as a DLL hereinafter) 23.

The register 21a is used to set a phase in the VDS mode, and the register 21b is used to set a phase in the FDS mode. The register 21c is used to set switching between the VDS and FDS modes, and the register 21d is used to set whether or not to execute automatic tuning (described later). The contents of these registers are set by the host device 21.

The sampling position setting unit 22 judges a clock position required for sampling, and outputs that position as a shift amount to the DLL 23. The DLL 23 phase-shifts a clock according to the shift amount from the sampling position setting unit 22.

The DLL 23 outputs a clock CLK_FP which allows a phase shift (delay) for one period at a highest frequency (for example, 208 MHz) in the VDS mode, a clock CLK_CP which allows a phase shift for half a period from the clock CLK_FP, and a clock_BP which allows a phase shift for another half period from the clock CLK_CP. These three clock signals are used when the current delay amount is detected in the VDS mode. In general, the central clock CLK_CP is used to sample a reception signal. The host device (CPU) 18 respectively sets phase shift amounts TF, T, and TB in three registers provided in the VDS phase setting register 21a in the FDS mode (low-speed clock) upon operating the SD card.

Note that an actual operation clock frequency of the SD card is decided as application. The VDS mode generally requires more complicated operations and larger power consumption than the FDS mode. Therefore, the sampling mode is decided according to the operation clock frequency. For example, even when an identical SD card is used, the FDS mode is adopted in case of a relatively low-speed application as low as several tens of megahertz, and the VDS mode is adopted in case of a high-speed application for, for example, image transfer.

Figure 3:
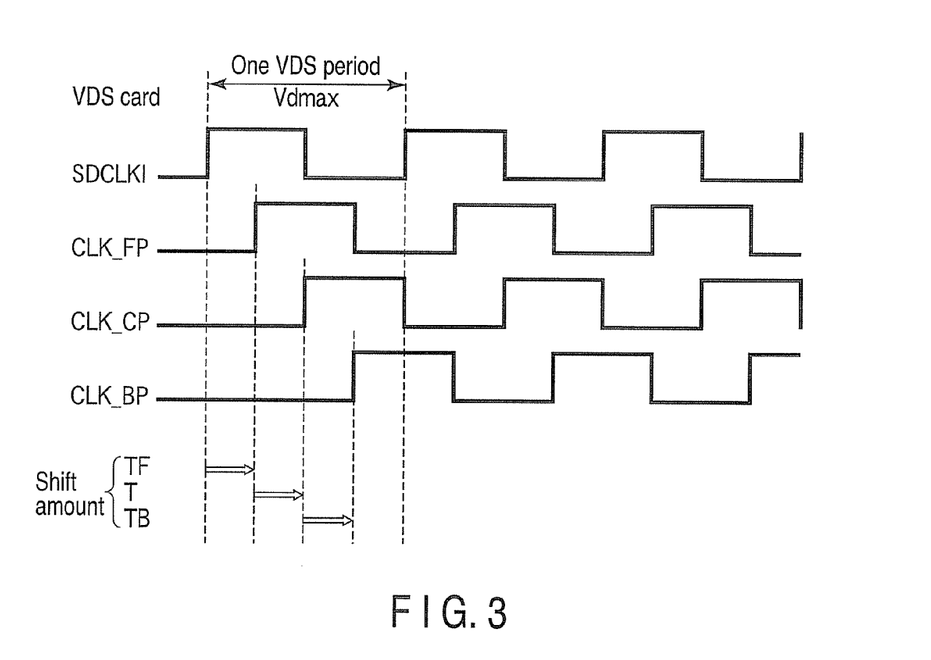
FIG. 3 is a chart showing a reference clock, and clocks which are phase-shifted according to shift amounts in a VDS mode.

FIG. 3 shows the reference clock SDCLKI, and the clocks CLK_FP, CLK_CP, and CLK_BP, which are phase-shifted according to the shift amounts TF, T, and TB in the VDS mode. The shift amount TF is a phase shift amount of the clock CLK_FP which has an earliest phase with respect to an input clock. The shift amount T is a phase shift amount from the clock CLK_FP to the central clock CLK_CP. The shift amount TB is a phase shift amount from the clock CLK_CP to the clock CLK_BP having a latest phase. That is, a phase shift amount from the reference clock SDCLKI to the clock CLK_BP having the latest phase corresponds to the sum of the shift amounts TF, T, and TB. Note that in the VDS mode, a temperature drift of the delay amount of a sampling clock is detected using the three clocks CLK_FP, CLK_CP, and CLK_BP which are phase-shifted from each other, as shown in FIG. 3, thus correcting the phase of the sampling clock.

As a maximum phase shift amount, the shift amount TF has one period (Vdmax) at a VDS highest operation frequency of the reference clock SDCLKI, and both of the shift amounts T and TB have half a period (Vdmax/2). The delay amount of the DLL 23 is a fixed value based on the setting values (TF, T, and TB) of the setting register 21a irrespective of the frequency of the input clock SDCLKI. Therefore, when the operation frequency is set to be lower than the VDS highest operation frequency, a maximum value of the shift amount TF is smaller than a delay amount for one period of the operation frequency.

In this embodiment, in order to allow to use the VDS mode DLL 23 having such characteristics also in the FDS mode, the FDS phase setting register 21b is added. The host device sets a phase setting value in the FDS mode in the FDS phase setting register 21b as a shift amount TFDS. The shift amount TFDS in the FDS mode is a phase shift amount from the reference clock SDCLKI.

Figure 4:
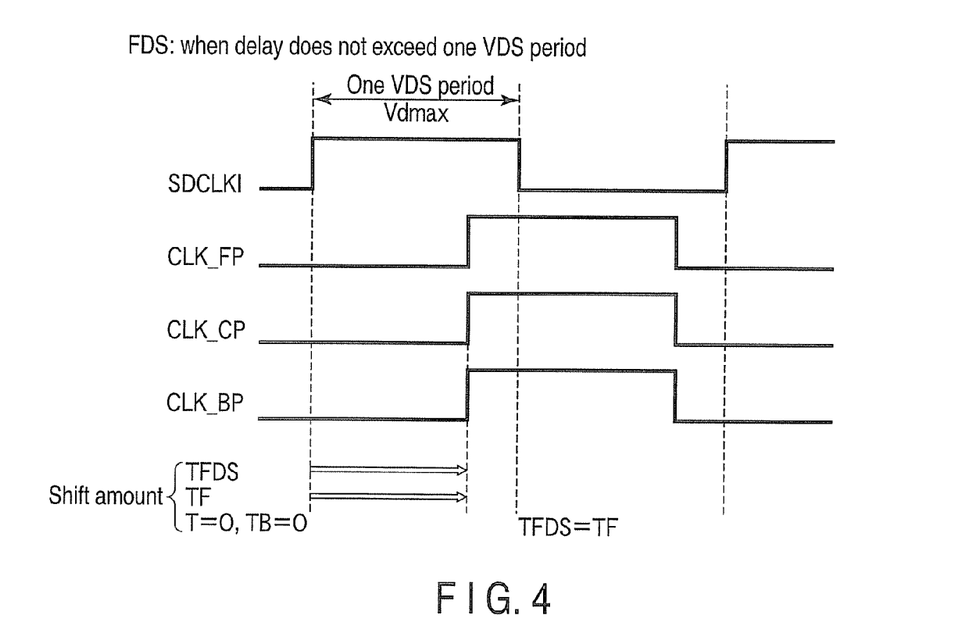
FIG. 4 is a chart showing a example of a phase relationship among a reference clock SDCLKI and respective clocks, and delay amount setting values in an FDS mode according to the first embodiment.

FIG. 4 shows the phase relationship among the reference clock SDCLKI and respective clocks, and delay amount setting values when a clock delay amount does not exceed one VDS period Vdmax in the FDS mode.

An operation frequency in the FDS mode is less than or equal to half the highest operation frequency in the VDS mode. When the delay amount set in the FDS mode does not exceed one period (the maximum delay amount Vdmax of the DLL 23) of the VDS mode highest frequency, the sampling position setting unit 22 outputs the shift amount TFDS set in the register 21b as the shift amount TF, and outputs "0" as the shift amounts T and TB.

In this way, the clock CLK_FP is delayed by TFDS, but the phases of the clocks CLK_CP and CLK_BP are the same as that of the clock CLK_FP, as shown in FIG. 4. As a result, the delay TFDS set in the setting register 21b is added to the central clock CLK_CP.

In this embodiment, in the FDS mode, the central clock CLK_CP is used as a sampling clock of reception data. The phase shift amount TFDS of the register 21b is a shift amount which is set by the host device as an appropriate value.

An operation when a clock delay amount exceeds one period Vdmax of the VDS highest frequency in the FDS mode will be described below.

As described above, the operation frequency in the FDS mode is less than or equal to half the highest frequency in the VDS mode. That is, in the FDS mode, the frequency of the input clock SDCLKI to the DLL 23 is generally much lower than that in the VDS mode. Therefore, by setting only the shift amount TF, a delay for one period in the FDS mode cannot be added to the clock SDCLKI.

Figure 5:
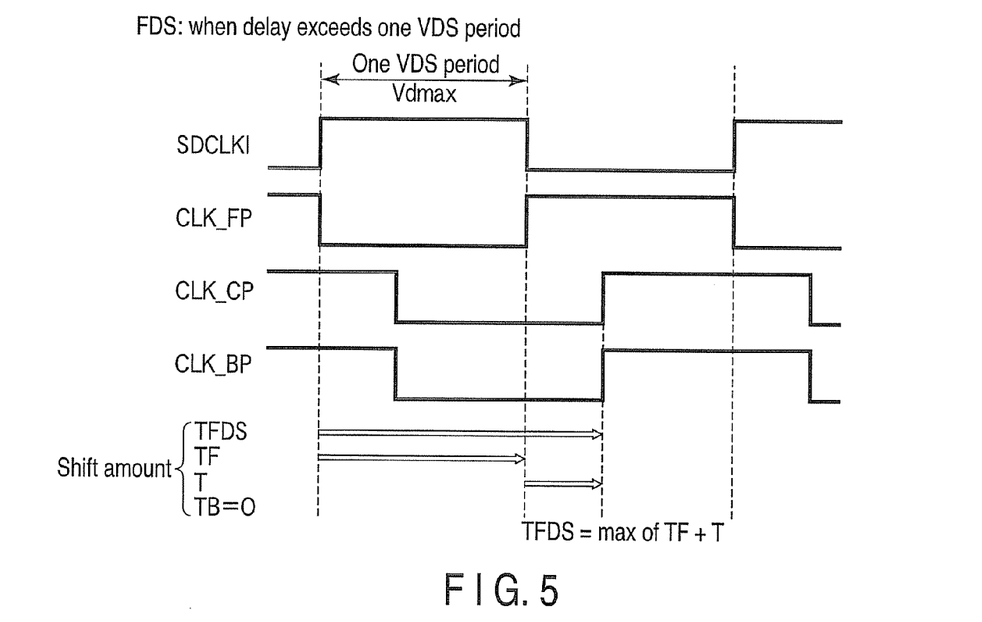
FIG. 5 is a chart showing another example of the phase relationship among the reference clock SDCLKI and respective clocks, and delay amount setting values in the FDS mode according to the first embodiment.

FIG. 5 shows the phase relationship among the reference clock SDCLKI and respective clocks, and the delay amount setting values when a clock delay amount exceeds one VDS period Vdmax in the FDS mode.

When a delay to be set exceeds one period Vdmax of the highest frequency in the VDS mode, the sampling phase setting unit 22 outputs the delay amount TFDS set in the register 21b while dividing it into the delay amounts TF and T. The maximum delay amount Vdmax in the VDS mode is set in the delay amount TF, and a deficient amount is set as the delay amount T. Therefore, the delay amount TFDS set in the register 21b can be added to the central clock CLK_CP, as shown in FIG. 5. As described above, the sampling signal generator 15 is configured to use the clock CLK_CP as a sampling clock of reception data.

As described above, according to this embodiment, the phase setting register 21b exclusively used for the FDS mode is arranged, and the host device sets the appropriate phase shift amount TFDS in the register 21b. The sampling phase setting unit 22 can give a shift amount corresponding to a delay amount of a signal from the SD card to the sampling clocks based on the shift amount TFDS.

According to this embodiment, the DLL 23 used in the VDS mode is shared in the FDS mode, and the appropriately delayed sampling clock CLK_CP can be output without using any feedback clock via a delay line (described later). In the FDS mode, a delay for one period of an FDS clock cannot be added to the sampling clock, but it suffices in practice when a delay within the range of FIG. 5 can be added.

Upon switching from the VDS mode to the FDS mode, since the appropriate shift amount is set in advance in the FDS register 21b, the DLL is immediately switched from the setting for the VDS mode to that for the FDS mode, and a delay amount in the FDS mode need not be set again.

The shift amount TFDS in the FDS mode to be set in the register 21b will be described below.

The shift amount (delay amount) TFDS set in the FDS phase setting register 21b has to be set in consideration of, for example, delay variations of the I/O buffer and wiring line, and a delay of an external wiring line. When it is difficult to decide the delay amount, the phase shift amount is decided by "tuning".

In this embodiment, the automatic tuning setting register 21d (1-bit register) used to instruct to decide a phase shift amount by tuning is arranged. When the host device decides the shift amount TFDS to be set in the register 21b by tuning, it sets, for example, "1" in the automatic tuning setting register.

When "1" is set in the automatic tuning register 21d, the sampling position setting unit 22 supplies the shift amount TFDS set in the setting register 21b to the DLL 23.

In an initialization sequence of the SD card, the host device loads the contents of a specific register in the SD card to check whether or not the SD card has a tuning pattern as a given data pattern. When the SD card has the tuning pattern, the host device decides the sampling position by performing the following tuning as in the VDS mode.

That is, the host device executes sampling by repetitively reading out a tuning pattern from the SD card while changing a shift amount of the sampling clock little by little using the setting register 21b. Then, the host device judges if data obtained by sampling matches the given tuning pattern, decides a shift amount with which correct data is obtained most stably as the shift amount TFDS, and sets it in the register 21b. In this way, an optimal shift amount is set in the register 21b.

When the SD card does not have any tuning pattern, the host device writes a tuning pattern in the SD card in advance using a slow clock used in initialization of the SD card before tuning. Tuning is executed, as described above, by reading out the tuning pattern which is written in advance, thus setting the optimal shift amount TFDS in the register 21b.

As described above, according to the embodiment, since the FDS setting register 21b is provided, the DLL 23 used in the VDS mode can be shared in the FDS mode. In this way, the need for external pins can be obviated, and the number of pins and power consumption can be reduced.

Also, the FDS setting register 21b allows delay adjustment according to an I/O delay in the host controller LSI and delay variations of a wiring line. Also, even when a wiring delay on the board has changed, a delay amount can be adjusted, thus providing an IP.

A modification of the present embodiment will be described below.

Figure 6:
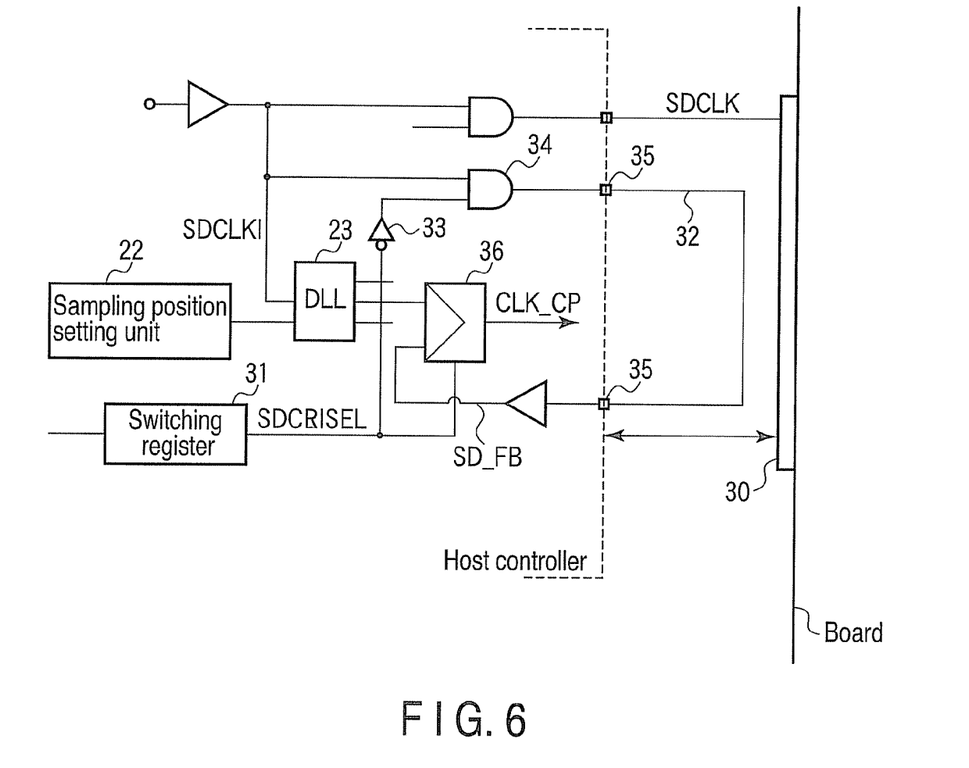
FIG. 6 is a circuit diagram showing the arrangement according to the second embodiment.

FIG. 6 shows the arrangement of a second embodiment.

This embodiment includes a switching register 31 which switches which of the internal clock SDCLKI of the host controller and an external clock obtained after it is transmitted via a delay line 32 is to be used as a sampling clock in the FDS mode, thus switching a sampling clock depending on the situation. A switching unit 36 switches the clock CLK_CP according to an input signal /SDCRISEL.

When it is difficult to add a required delay to the internal clock SDCLKI using the DLL in the FDS mode because of the characteristics of the DLL 23 designed for the VDS mode, an external feedback clock SD_FB transmitted via the delay line 32 is selected.

In order to decide a delay amount of the DLL, the shift amount of the DLL need only be adjusted to add the same delay as the external feedback clock transmitted via the delay line 32 to the sampling clock.

Furthermore, after the shift amount of the DLL 23 is decided in this way, since a clock need not be transmitted through the delay line 32, it is stopped by arranging an AND gate 34 on the clock SDCLKI output side, thus reducing power consumption.

According to the second embodiment, when an internal clock cannot be used depending on the characteristics of the DLL, a sampling clock having an appropriate phase can be generated using a delay produced by the delay line by the sampling clock switching function.

Figure 7:
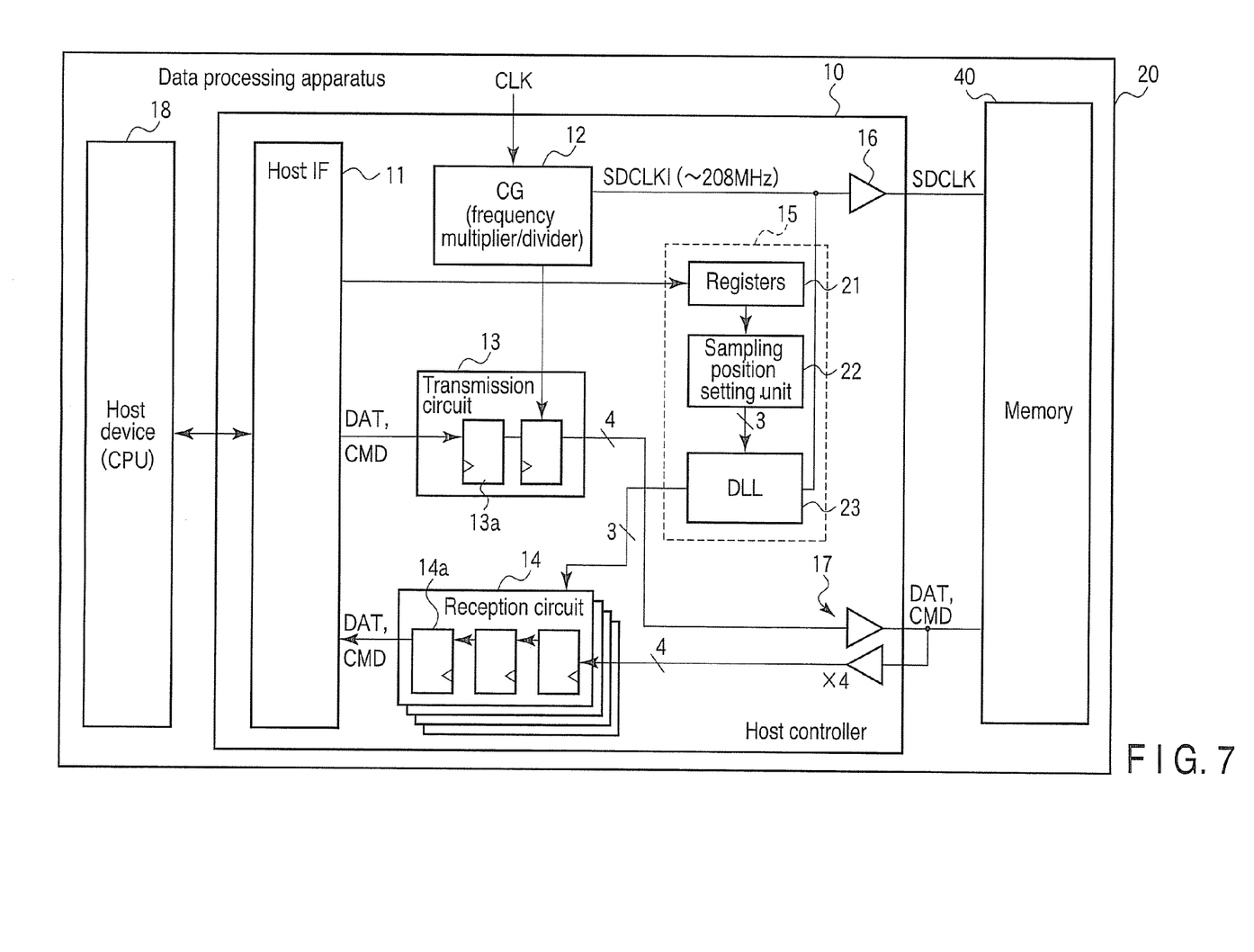
FIG. 7 is a block diagram showing the whole arrangement of the host controller which the third embodiment is applied.

FIG. 7 is a block diagram showing the principal part arrangement according to the third embodiment of a data processing system.

In the data processing system according to this embodiment, the data processing system 20 have a memory 40, host device 18 and a host controller 10 built-in. The memory 19, host device 21, and host controller 10 may be configured in a single housing, on a single substrate, or on one chip according to the types and applications of systems.

Figure 8:
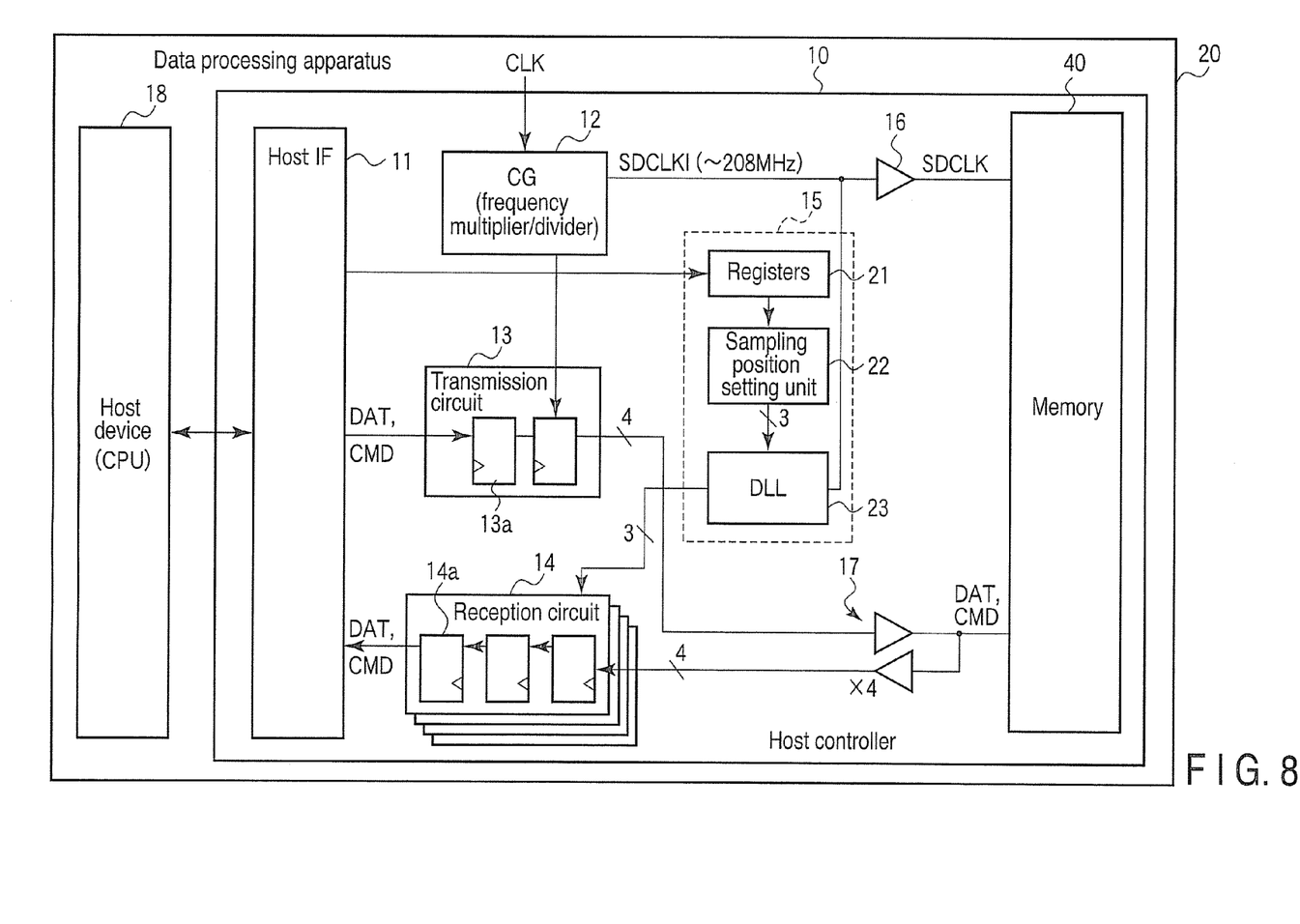
FIG. 8 is a block diagram showing the whole arrangement of the host controller which the fourth embodiment is applied.

FIG. 8 is a block diagram showing the principal part arrangement according to the forth embodiment of a data processing system.

In the data processing system according to this embodiment, a memory 40 is arranged in a host controller 10, and this host controller 10 is configured on a single substrate or as a single semiconductor chip. The host controller 10 and host device 18 may be configured in a single housing or on a single substrate according to the types and applications of systems.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A host controller, which samples reception data, comprising:
   a variable data sampling (VDS) phase register configured to hold a phase shift amount in a VDS mode;
   a fixed data sampling (FDS) phase register configured to hold a phase shift amount in an FDS mode;
   a mode setting unit configured to indicate in which of the VDS mode and the FDS mode, data is sampled;
   a sampling position setting unit configured to select the phase shift amount set in one of the VDS phase register and the FDS phase register in accordance with a setting value of the mode setting unit, and to provide the selected phase shift amount as a sampling position; and
   a clock phase shift unit configured to shift a phase of an input clock signal in accordance with a shift amount provided from the sampling position setting unit, and to provide the shifted input clock signal as a sampling clock.

2. The host controller of claim 1, further comprising:
   an automatic tuning register configured to set whether or not to execute FDS automatic tuning, the sampling position setting unit being configured to select the phase shift amount set in the FDS phase register when the FDS automatic tuning is set in the FDS automatic tuning register; and
   a unit configured to automatically set an FDS sampling position by tuning at the time of initialization.

3. The host controller of claim 1, further comprising:
   a switching unit configured to switch which of an internal clock and an external clock obtained by delaying the internal clock using an external delay line is used as a sampling clock.

4. The host controller of claim 1, wherein the reception data is data supplied from an SD card.

5. A semiconductor device including a host controller configured to sample reception data, comprising:
   a variable data sampling (VDS) configured to hold a phase shift amount in a VDS mode;
   a fixed data sampling (FDS) configured to hold a phase shift amount in an FDS mode;
   a mode setting unit configured to indicate in which of the VDS mode and the FDS mode, data is sampled;
   a sampling position setting unit configured to select the phase shift amount set in one of the VDS phase register and the FDS phase register in accordance with a setting value of the mode setting unit, and to provide the selected phase shift amount as a sampling position; and
   a clock phase shift unit configured to shift a phase of an input clock signal in accordance with a shift amount provided from the sampling position setting unit, and to provide the shifted input clock signal as a sampling clock.

6. The semiconductor device of claim 5, further comprising:
   an automatic tuning register configured to set whether or not to execute FDS automatic tuning, the sampling position setting unit being configured to select the phase shift amount set in the FDS phase register when the FDS automatic tuning is set in the FDS automatic tuning register; and
   a unit configured to automatically set an FDS sampling position by tuning at the time of initialization.

7. The semiconductor device of claim 5, further comprising:
   a switching unit configured to switch which of an internal clock and an external clock obtained by delaying the internal clock using an external delay line is used as a sampling clock.

8. The semiconductor device of claim 5, wherein the reception data is data supplied from an SD card.

9. The semiconductor device of claim 5, further comprising: a memory device configured to output the reception data, the memory device and the host controller being configured on one chip.

10. A method of sampling reception data, comprising:
    holding, in a variable data sampling (VDS) phase register, a phase shift amount obtained in a VDS mode;
    holding, in a fixed data sampling (FDS) phase register, a phase shift amount obtained in an FDS mode;
    indicating, using a mode setting unit, in which of the VDS mode and the FDS mode data is sampled;
    selecting the phase shift amount set in one of the VDS phase register and the FDS phase register in accordance with a setting value of the mode setting unit; and
    shifting a phase of an input clock signal in accordance with the selected phase shift amount, and providing the shifted input clock signal as a sampling clock.

11. The method of claim 10, further comprising:
    setting, using an automatic tuning register, whether or not to execute FDS automatic tuning;
    selecting the shift amount set in the FDS phase register when the FDS automatic tuning is set in the FDS automatic tuning register; and
    automatically setting an FDS sampling position by tuning at the time of initialization.

12. The method of claim 10, further comprising:
    switching which of an internal clock and an external clock obtained by delaying the internal clock using an external delay line is used as a sampling clock.

13. The method of claim 10, wherein the reception data is supplied from an SD card.

* * * * *